United States Patent
Jung

(10) Patent No.: US 9,859,877 B2
(45) Date of Patent: Jan. 2, 2018

(54) SIGNAL PROCESSING CIRCUIT

(71) Applicant: SK hynix Inc., Icheon-si, Gyeonggi-do (KR)

(72) Inventor: Jae Hoon Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/072,613

(22) Filed: Mar. 17, 2016

(65) Prior Publication Data

US 2017/0141770 A1     May 18, 2017

(30) Foreign Application Priority Data

Nov. 17, 2015   (KR) .......................... 10-2015-0160975

(51) Int. Cl.
*H03L 7/00*     (2006.01)
*H03K 3/66*     (2006.01)
*G11C 7/22*     (2006.01)

(52) U.S. Cl.
CPC ................. *H03K 3/66* (2013.01); *G11C 7/22* (2013.01); *G11C 7/222* (2013.01); *G11C 7/225* (2013.01)

(58) Field of Classification Search
CPC ....................................................... H03K 3/66
See application file for complete search history.

(56) References Cited

U.S. PATENT DOCUMENTS

2006/0221088 A1   10/2006   Aoki
2014/0313847 A1*   10/2014   Jeong ....................... G11C 8/18
                                                365/233.12

FOREIGN PATENT DOCUMENTS

KR    1019990023076 A    3/1999
KR    1020100050953 A    5/2010
KR    1020120052029 A    5/2012
KR    1020140124553 A    10/2014

* cited by examiner

*Primary Examiner* — Daniel Puentes
(74) *Attorney, Agent, or Firm* — William Park & Associates Ltd.

(57) ABSTRACT

A signal processing circuit may be provided. The signal processing circuit may include a mask generation circuit configured to output a mask signal in response to an internal control signal and masking information; and a masking circuit configured to mask the internal control signal in response to the mask signal, and output a masked control signal, wherein the mask generation circuit resets the mask signal in response to an internal reset signal, regardless of a pause polarity of the internal control signal.

13 Claims, 9 Drawing Sheets

SIGNAL PROCESSING CIRCUIT

CROSS-REFERENCES TO RELATED APPLICATION

The present application claims priority under 35 U.S.C. §119(a) to Korean application number 10-2015-0160975, filed on Nov. 17, 2015, in the Korean Intellectual Property Office, which is incorporated herein by reference in its entirety.

BACKGROUND

1. Technical Field

Various embodiments generally relate to a signal processing circuit, and, more particularly, to a signal processing circuit of a semiconductor memory device.

2. Related Art

Semiconductor memory devices may be used to store data. Semiconductor memory devices may include a nonvolatile memory device and a volatile memory device.

The nonvolatile memory devices maintain data stored therein even though power is cut off. The nonvolatile memory devices include flash memory devices such as NAND flash or NOR flash, Ferroelectrics Random Access Memory (FeRAM), Phase-Change Random Access Memory (PCRAM), Magnetoresistive Random Access Memory (MRAM) or Resistive Random Access Memory (ReRAM).

Volatile memory devices fail to maintain data stored therein when power is cut off. Volatile memory devices include Static Random Access Memory (SRAM) and Dynamic Random Access Memory (DRAM). Volatile memory devices are generally used as buffer memory devices, cache memory devices, or working memory devices in data processing systems, due to their relatively high processing speeds.

SUMMARY

In an embodiment, a signal processing circuit may be provided. The signal processing circuit may include a mask generation circuit configured to output a mask signal in response to an internal control signal and masking information. The signal processing circuit may include a masking circuit configured to mask the internal control signal in response to the mask signal, and output a masked control signal. The mask generation circuit may reset the mask signal in response to an internal reset signal, regardless of a pause polarity of the internal control signal.

In an embodiment, a signal processing circuit may be provided. The signal processing circuit may include a mask generation circuit configured to output a mask signal in response to a transfer control signal and masking information. The signal processing circuit may include a masking circuit configured to mask an internal control signal in response to the mask signal, and output a masked control signal. The signal processing circuit may include a control circuit configured to enable or disable the mask generation circuit by outputting the transfer control signal in response to the internal control signal and the mask signal.

In an embodiment, a signal processing circuit may be provided. The signal processing circuit may include a mask generation circuit configured to output a mask signal in response to an internal control signal. The signal processing circuit may include a buffer configured to output the internal control signal in response to an external control signal received by the signal processing circuit. The mask generation circuit may reset the mask signal in response to an internal reset signal, regardless of a pause polarity of the internal control signal.

DETAILED DESCRIPTION

Figure 1:
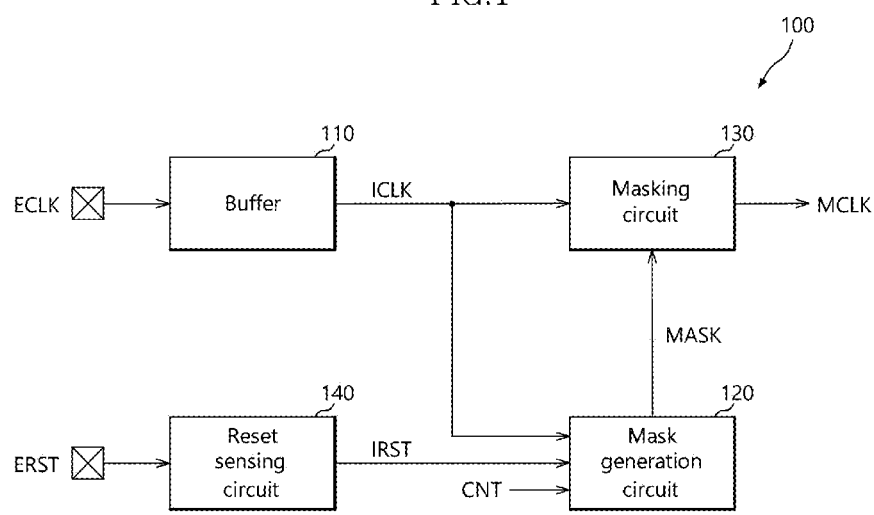
FIG. 1 is a block diagram schematically illustrating a representation of an example of a signal processing circuit of a semiconductor memory device in accordance with an embodiment.

Hereinafter, a data storage device and an operating method thereof will be described with reference to the accompanying drawings through examples of embodiments. The examples may, however, be embodied in different forms and should not be construed as being limited to the embodiments set forth herein. Rather, these embodiments are provided to describe examples to the extent that a person skilled in the art to which the embodiments pertain can enforce the technical concepts of the disclosure.

It is to be understood that embodiments are not limited to the particulars illustrated in the drawings, that the drawings are not necessarily to scale, and, in some instances, proportions may have been exaggerated in order to more clearly depict certain features. While particular terminology is used, it is to be appreciated that the terminology used is for describing particular embodiments only and is not intended to limit the scope of the disclosure.

FIG. 1 is a block diagram schematically illustrating a representation of an example of a signal processing circuit 100 of a semiconductor memory device in accordance with an embodiment.

The signal processing circuit 100 may include a buffer 110, a mask generation circuit 120, a masking circuit 130, and a reset sensing circuit 140.

The buffer 110 may output an internal control signal ICLK, in response to an external control signal ECLK transmitted through a pad from an external device. The external control signal ECLK may be, for example, a read enable signal which is used to latch and process data to be transmitted to the external device, in a read operation of the semiconductor memory device. The external control signal ECLK may be, for example, a data strobe signal which is used to latch and process data transmitted from the external device, in a write operation of the semiconductor memory device. The buffer 110 may output a predetermined initial value as the internal control signal ICLK, during a period in which the external control signal ECLK is undefined, and may buffer the external control signal ECLK in response to the preamble of the external control signal ECLK and output the internal control signal ICLK.

The mask generation circuit 120 may output a mask signal MASK in response to the internal control signal ICLK and masking information CNT. The masking information CNT may include information for the number of clock cycles to be masked or skipped in the internal control signal ICLK, that is, a masking cycle. Masking cycles may have the values of "0," "1," "2" and "4," but the embodiment is not limited to such values. The mask generation circuit 120 may generate pre-mask signals corresponding to various masking cycles by using the internal control signal ICLK, and may select a pre-mask signal according to the masking information CNT and output the mask signal MASK.

The masking circuit 130 may mask the internal control signal ICLK in response to the mask signal MASK, and output a masked control signal MCLK. The masking circuit 130 may output the masked control signal MCLK where clock cycles, the number of which corresponds to a masking cycle, are skipped in the internal control signal ICLK, by using the mask signal MASK on which the masking information CNT is reflected.

The reset sensing circuit 140 may output an internal reset signal IRST in response to a pause reset signal ERST.

During an initial period in which a signal is transmitted between the external device and the semiconductor memory device, the integrity of the signal may be difficult to be ensured. Accordingly, the external device and the semiconductor memory device may be set to neglect a predetermined number of initial clock cycles, that is, initial clock cycles corresponding to a masking cycle, in the signal transmitted between the external device and the semiconductor memory device. The external device may set the masking information CNT in the semiconductor memory device, and accordingly, the external device and the semiconductor memory device may be smoothly interfaced with each other according to the set masking information CNT. The external device may skip initial clock cycles corresponding to the masking cycle in the external control signal ECLK, for example, the data strobe signal, and may transmit write data in synchronization with subsequent clock cycles. In this case, the semiconductor memory device may generate the masked control signal MCLK by skipping initial clock cycles corresponding to the masking cycle, from the received data strobe signal, and may latch the write data based on the masked control signal MCLK, thereby skipping meaningless write data.

The external device may pause input and output of data to and from the semiconductor memory device. The external device may pause input and output of data, for example, by retaining the external control signal ECLK at a predetermined polarity, that is, a logic high or a logic low. A pause polarity may mean a polarity state of the external control signal ECLK which is inputted when entering a pause state. The semiconductor memory device may be aware that the pause state has been entered, according to the external control signal ECLK which is retained at the pause polarity.

The external device may transmit the pause reset signal ERST to the semiconductor memory device to exit the pause state and restart input and output of data in a pause reset state. The mask generation circuit 120 may reset the mask signal MASK in response to the internal reset signal IRST based on the pause reset signal ERST, and the masking circuit 130 may newly output the masked control signal MCLK on which a masking cycle is reflected by using the reset mask signal MASK. Therefore, when input and output of data with respect to the external device is restarted in the pause reset state, data may be processed, with a masking cycle precisely reflected, like in initial transmission in a state other than the pause reset state, that is, a normal state.

The signal processing circuit 100 may output the masked control signal MCLK on which a masking cycle is reflected, like in the normal state, even in the pause reset state. The signal processing circuit 100 may operate in the pause reset state under a condition different from the normal state. For example, the external control signal ECLK may be continuously retained at the pause polarity in the pause reset state, and may not include a preamble. In a present embodiment, regardless of the pause polarity of the external control signal ECLK in the pause reset state, the mask generation circuit 120 may be reset in response to the pause reset signal ERST and the mask signal MASK may be generated in response to the rising edge of the external control signal ECLK, by which it is possible to output the masked control signal MCLK on which a masking cycle is newly reflected.

Figure 2:
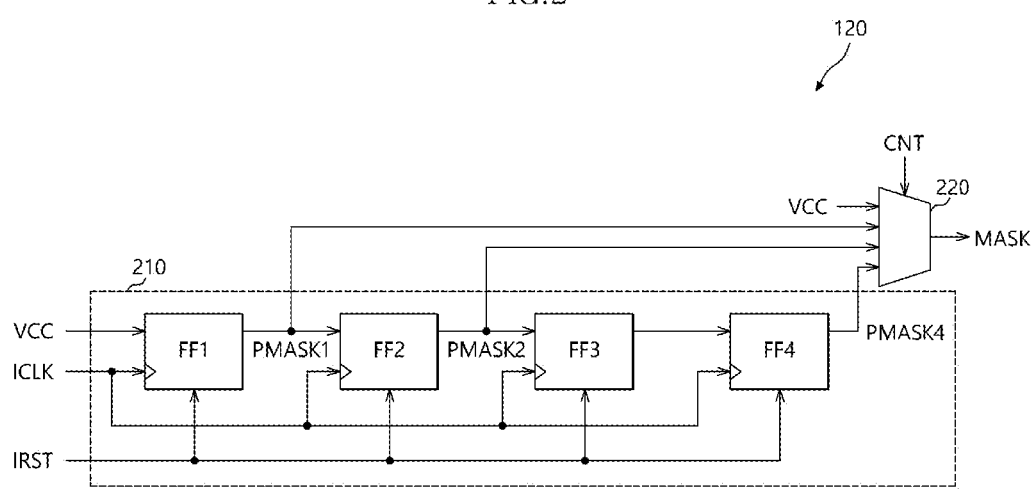
FIG. 2 is a circuit diagram illustrating a representation of an example of the configuration of the mask generation circuit illustrated in FIG. 1.

FIG. 2 is a circuit diagram illustrating a representation of an example of the configuration of the mask generation circuit 120 illustrated in FIG. 1.

The mask generation circuit 120 may include a pre-mask generating circuit 210 and a selecting circuit 220.

The pre-mask generating circuit 210 may shift an input signal, for example, an operation voltage VCC, in response to the internal control signal ICLK, and may output a plurality of pre-mask signals PMASK1, PMASK2 and PMASK4. The pre-mask generating circuit 210 may be configured by, for example, a 4-bit shifter. The 4-bit shifter may include flip-flops FF1 to FF4 which are coupled in series. The flip-flops FF1 to FF4 may sequentially shift the input signal VCC in response to the rising edge of the internal control signal ICLK. The pre-mask generating circuit 210 may provide the outputs of the flip-flops FF1, FF2 and FF4 which are preset according to supportable masking cycles, for example, masking cycles of "0," "1," "2" and "4," as the pre-mask signals PMASK1, PMASK2 and PMASK4. The flip-flops FF1 to FF4 may be reset in response to the internal reset signal IRST.

The selecting circuit 220 may output any one of the input signal VCC and the pre-mask signals PMASK1, PMASK2 and PMASK4, as the mask signal MASK, in response to the masking information CNT. The selecting circuit 220 may output the output of the flip-flop FF1 as the mask signal MASK, for example, when a masking cycle corresponding to the masking information CNT is "1."

Figure 3:
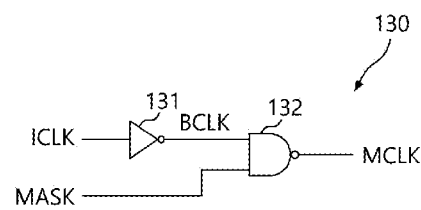
FIG. 3 is a circuit diagram illustrating a representation of an example of the configuration of the masking circuit illustrated in FIG. 1.

FIG. 3 is a circuit diagram illustrating a representation of an example of the configuration of the masking circuit 130 illustrated in FIG. 1.

The masking circuit 130 may mask the internal control signal ICLK in response to the mask signal MASK on which a masking cycle is reflected, and output the masked control signal MCLK.

The masking circuit 130 may include an inverter 131 and a logic gate, for example, a NAND gate 132. The inverter 131 may invert the internal control signal ICLK, and output an inverted control signal BCLK. The NAND gate 132 may perform a NAND logic function on the inverted control signal BCLK and the mask signal MASK, and output the masked control signal MCLK.

Figure 4:
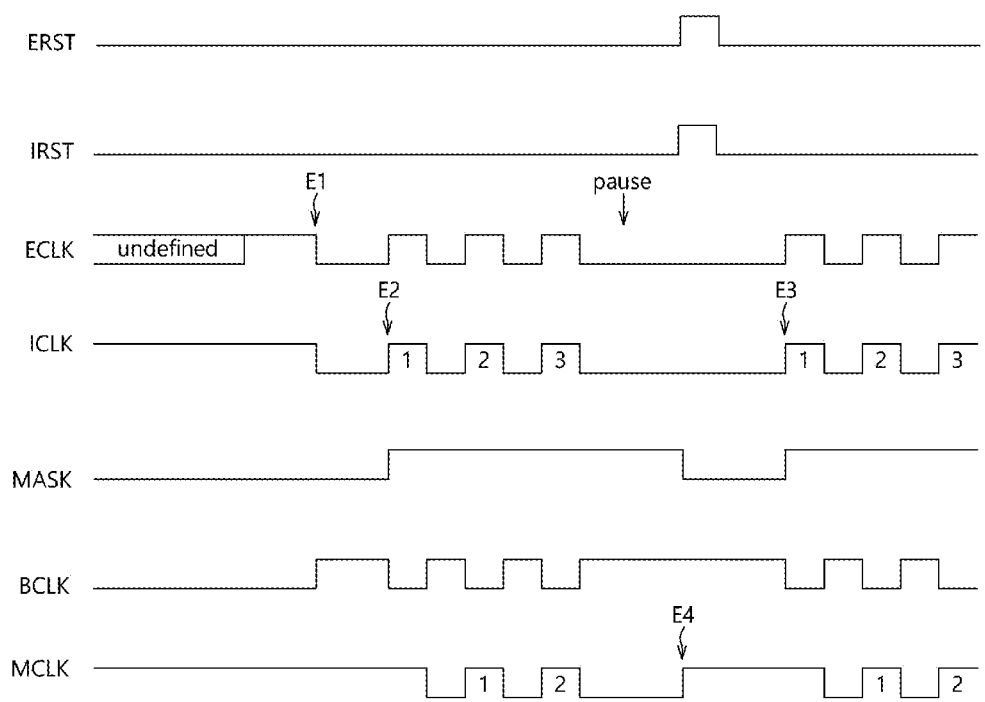
FIG. 4 is a representation of an example of a timing diagram to assist in the explanation of the operation of the signal processing circuit of FIG. 1.

FIG. 4 is a representation of an example of a timing diagram to assist in the explanation of the operation of the signal processing circuit 100 of FIG. 1. Hereinbelow, the operation of the signal processing circuit 100 will be described with reference to FIGS. 1 to 4.

The buffer 110 may neglect the external control signal ECLK inputted during the undefined period, and output the internal control signal ICLK of the predetermined initial value, for example, a logic high. The buffer 110 may buffer the external control signal ECLK in response to a preamble E1 of the falling edge of the external control signal ECLK, and output the internal control signal ICLK.

The mask generation circuit 120 may generate the mask signal MASK in response to a rising edge E2 of the internal control signal ICLK. FIG. 4 illustrates the mask signal MASK which is generated, for example, when a masking cycle corresponding to the masking information CNT is "1." For example, the flip-flop FF1 of the mask generation circuit 120 may output the pre-mask signal PMASK1 of a logic high in response to the rising edge E2 of the internal control signal ICLK, and the selecting circuit 220 may output the pre-mask signal PMASK1 outputted from the flip-flop FF1, as the mask signal MASK, in response to the masking information CNT.

The masking circuit 130 may invert the internal control signal ICLK and generate the inverted control signal BCLK, and may perform the NAND logic function on the inverted control signal BCLK and the mask signal MASK and generate the masked control signal MCLK. The masked control signal MCLK may be outputted as 1 clock is skipped in the internal control signal ICLK according to the masking cycle of "1."

Then, the external device may pause input and output of data with respect to the semiconductor memory device by retaining the external control signal ECLK at the pause polarity, for example, the logic low. The external device may transmit the pause reset signal ERST to exit the pause state. The reset sensing circuit 140 may output the internal reset signal IRST in response to the pause reset signal ERST.

The mask generation circuit 120 may reset the mask signal MASK in response to the internal reset signal IRST. For example, the flip-flops FF1 to FF4 of the mask generation circuit 120 may be reset in response to the internal reset signal IRST, and the selecting circuit 220 may output the pre-mask signal PMASK1 reset to a logic low, as the mask signal MASK. Thereafter, the mask generation circuit 120 may generate the mask signal MASK in response to a rising edge E3 of the internal control signal ICLK which is initially transmitted in the pause reset state. The mask generation circuit 120 may generate the mask signal MASK in the pause reset state in substantially the same manner as in an operation in the normal state. The masking circuit 130 may output the masked control signal MCLK in which 1 clock is skipped in the internal control signal ICLK according to the masking cycle of "1," in response to the mask signal MASK.

The masking circuit 130 may output a rising edge E4 of the masked control signal MCLK in response to the falling edge of the mask signal MASK which is generated as the mask signal MASK is reset. However, when the pause reset signal ERST is applied, since a data path of the semiconductor memory device does not operate, the rising edge E4 of the masked control signal MCLK may be neglected.

Figure 5:
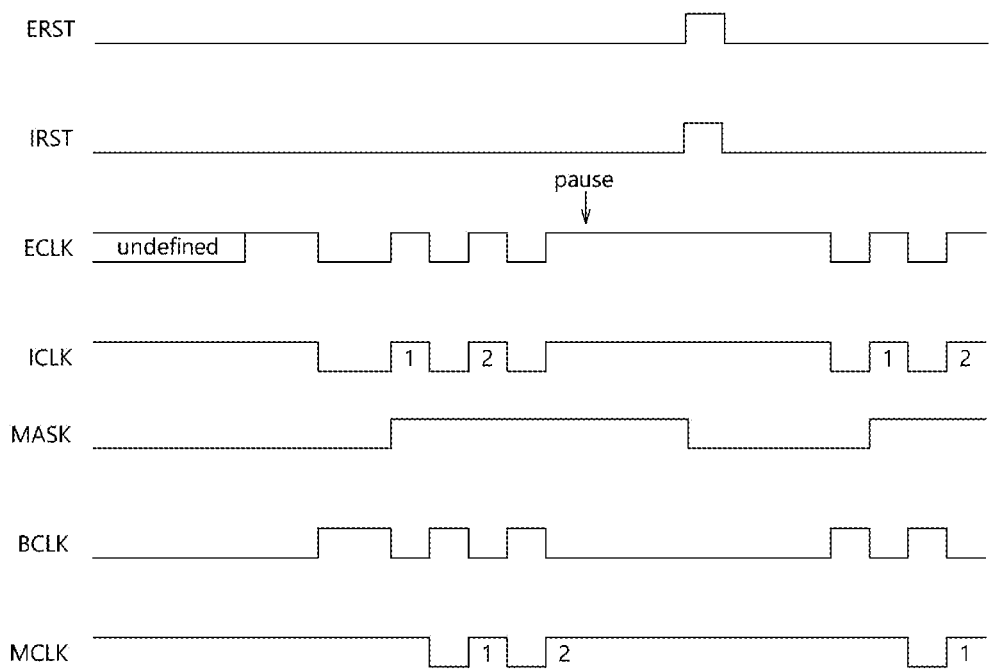
FIG. 5 is a representation of an example of a timing diagram to assist in the explanation of the operation of the signal processing circuit of FIG. 1.

FIG. 5 is a representation of an example of a timing diagram to assist in the explanation of the operation of the signal processing circuit 100 of FIG. 1.

Referring to FIG. 5, unlike FIG. 4, the external device may pause input and output of data with respect to the semiconductor memory device by retaining the external control signal ECLK at, for example, the logic high. The external device may transmit the pause reset signal ERST to exit the pause state.

As described above, the mask generation circuit 120 may be reset in response to the internal reset signal IRST and output the mask signal MASK in response to the rising edge of the external control signal ECLK, regardless of the pause polarity of the external control signal ECLK, in the pause reset state. The masking circuit 130 may output the masked control signal MCLK in which 1 clock is skipped in the internal control signal ICLK according to the masking cycle of "1," in response to the mask signal MASK.

Figure 6:
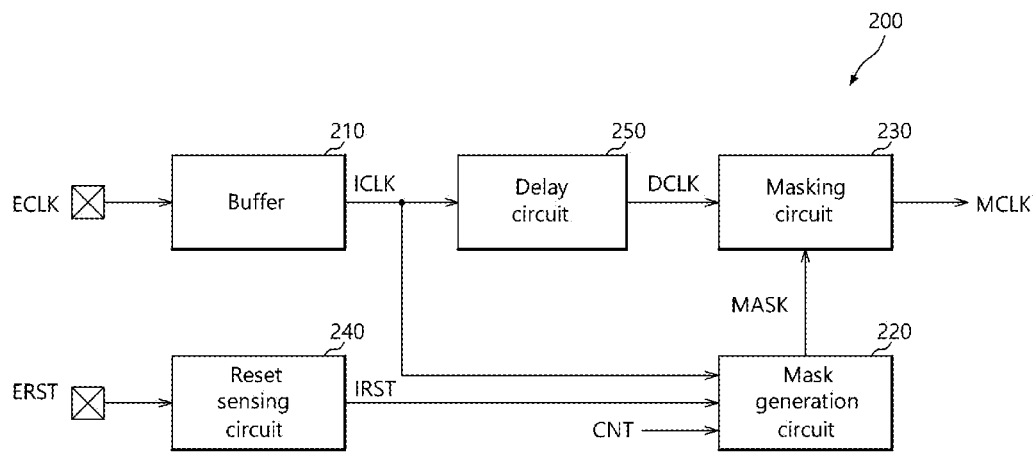
FIG. 6 is a block diagram schematically illustrating a representation of an example of a signal processing circuit of a semiconductor memory device in accordance with an embodiment.

FIG. 6 is a block diagram schematically illustrating a representation of an example of a signal processing circuit 200 of a semiconductor memory device in accordance with an embodiment.

Referring to FIG. 6, the signal processing circuit 200 may further include a delay circuit 250 in comparison with the signal processing circuit 100 of FIG. 1. Since components except the delay circuit 250 may be configured and operate in substantially the same manner as the components of FIG. 1, detailed descriptions thereof will be omitted herein.

The delay circuit 250 may delay the internal control signal ICLK and output a delayed control signal DCLK, in order to compensate for a time during which the internal control signal ICLK is processed by a mask generation circuit 220. A masking circuit 230 may output the masked control signal MCLK where clock cycles, the number of which corresponds to a masking cycle, are skipped in the delayed control signal DCLK, by using the mask signal MASK.

Figure 7:
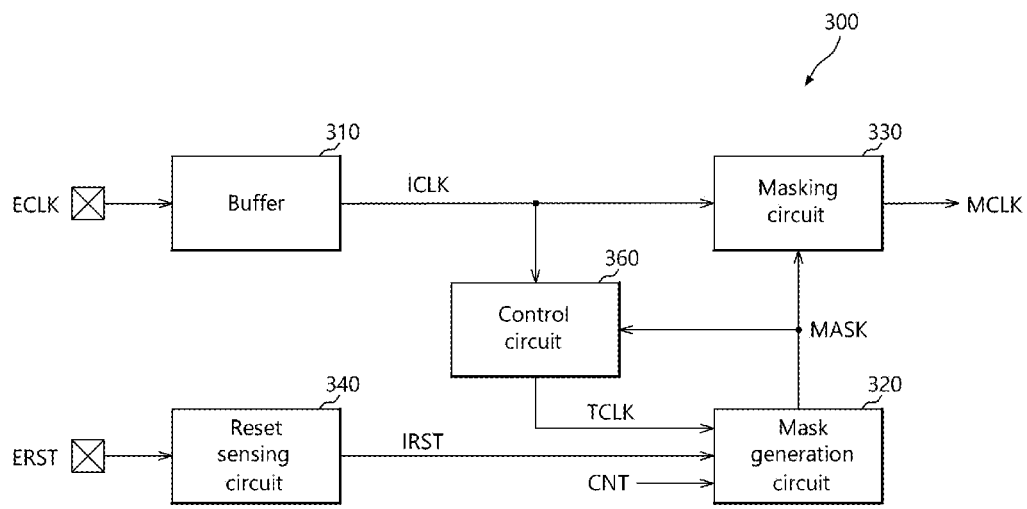
FIG. 7 is a block diagram schematically illustrating a representation of an example of a signal processing circuit of a semiconductor memory device in accordance with an embodiment.

FIG. 7 is a block diagram schematically illustrating a representation of an example of a signal processing circuit 300 of a semiconductor memory device in accordance with an embodiment.

Referring to FIG. 7, the signal processing circuit 300 may further include a control circuit 360 in comparison with the signal processing circuit 100 of FIG. 1. Since components except the control circuit 360 may be configured and operate in substantially the same manner as the components of FIG. 1, detailed descriptions thereof will be omitted herein.

The control circuit 360 may output a transfer control signal TCLK and thereby enable or disable a mask generation circuit 320, in response to the internal control signal ICLK and the mask signal MASK. The control circuit 360 may output the internal control signal ICLK, as the transfer control signal TCLK which is enabled, in response to the mask signal MASK which is disabled, that is, the mask signal MASK on which a masking cycle is not reflected yet. For example, the control circuit 360 may output the rising edge of the internal control signal ICLK, as the rising edge of the transfer control signal TCLK, in response to the disabled mask signal MASK. The control circuit 360 may block the internal control signal ICLK from the mask generation circuit 320 and output the transfer control signal TCLK which is disabled, in response to the mask signal MASK which is enabled, that is, the mask signal MASK on which a masking cycle is reflected.

The mask generation circuit 320 may be configured in substantially the same manner as the mask generation circuit 120 of FIG. 2, except that it is inputted with the transfer control signal TCLK instead of the internal control signal ICLK. The mask generation circuit 320 may generate the enabled mask signal MASK in response to the enabled transfer control signal TCLK, and may then be disabled in a state in which the enabled mask signal MASK is retained, in response to the disabled transfer control signal TCLK. The reason to this resides in that, once the enabled mask signal MASK is outputted, the pre-mask generating circuit 210 does not perform shifting any more in response to the disabled transfer control signal TCLK, and the selecting circuit 220 retains a selected pre-mask signal, as the enabled mask signal MASK. The mask generation circuit 320 may retain the enabled mask signal MASK until it is reset in response to the internal reset signal IRST.

Therefore, controlling disablement of the mask generation circuit 320 through the control circuit 360 may be effective to save power consumption.

Figure 8:
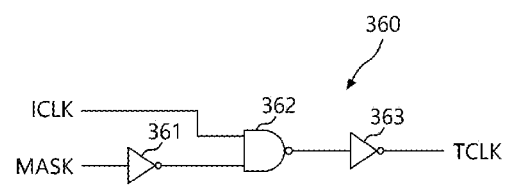
FIG. 8 is a circuit diagram illustrating a representation of an example of the configuration of the control circuit illustrated in FIG. 7.

FIG. 8 is a circuit diagram illustrating a representation of an example of the configuration of the control circuit 360 illustrated in FIG. 7.

The control circuit 360 may include inverters 361 and 363 and a logic gate, for example, a NAND gate 362. The inverter 361 may invert the mask signal MASK and output the inverted signal of the mask signal MASK. The NAND gate 362 may perform a NAND logic function on the internal control signal ICLK and the output of the inverter 361. The inverter 363 may invert the output of the NAND gate 362, and output the transfer control signal TCLK.

Figure 9:
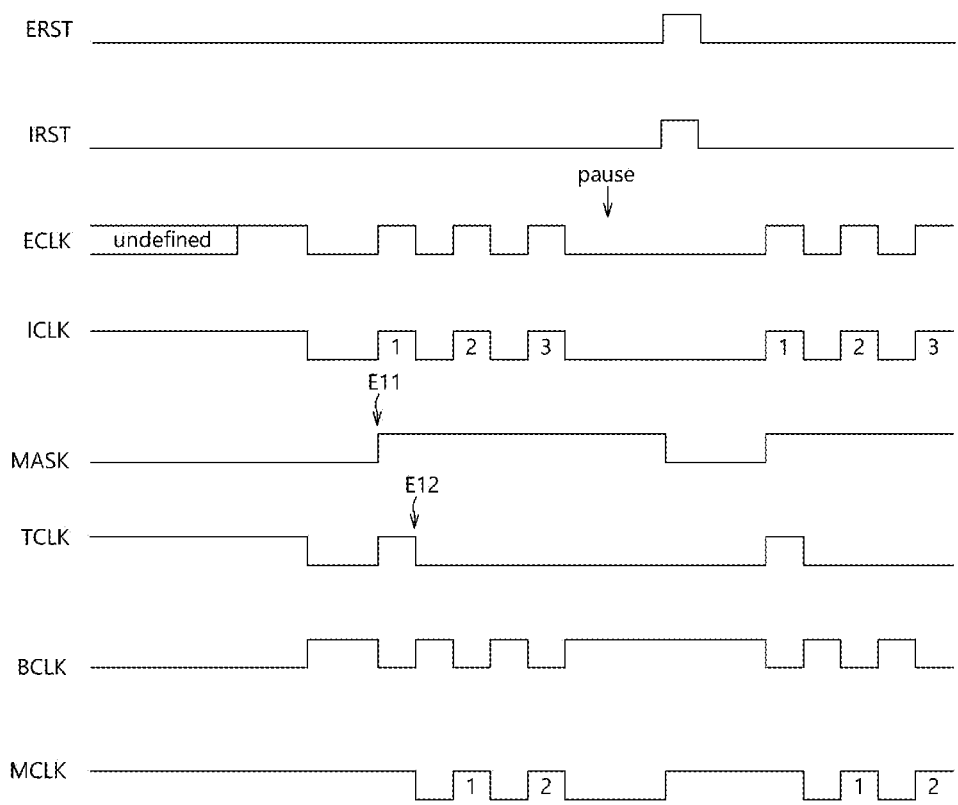
FIG. 9 is a representation of an example of a timing diagram to assist in the explanation of the operation of the signal processing circuit of FIG. 7.

FIG. 9 is a representation of an example of a timing diagram to assist in the explanation of the operation of the signal processing circuit 300 of FIG. 7.

Referring to FIG. 9, the control circuit 360 may output the internal control signal ICLK, as the transfer control signal TCLK, in response to the mask signal MASK which is disabled to a logic low. The control circuit 360 may output the disabled transfer control signal TCLK (see E12) in response to the mask signal MASK (see E11) which is enabled to a logic high.

The mask generation circuit 320 may output the enabled mask signal MASK until it is reset in response to the internal reset signal IRST, even though the transfer control signal TCLK is disabled.

Figure 10:
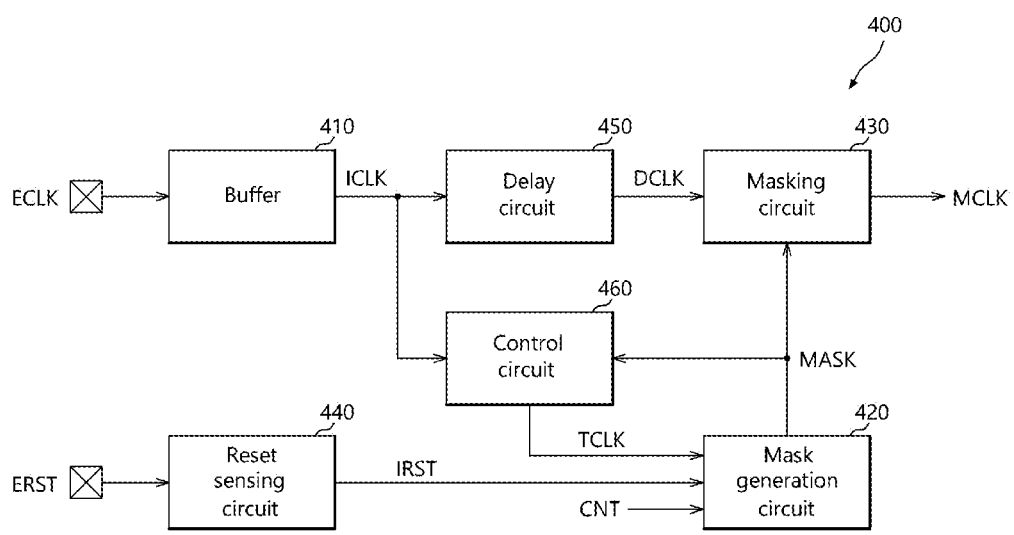
FIG. 10 is a block diagram schematically illustrating a representation of an example of a signal processing circuit of a semiconductor memory device in accordance with an embodiment.

FIG. 10 is a block diagram schematically illustrating a representation of an example of a signal processing circuit 400 of a semiconductor memory device in accordance with an embodiment.

Referring to FIG. 10, the signal processing circuit 400 may further include a delay circuit 450 and a control circuit 460 in comparison with the signal processing circuit 100 of FIG. 1. The delay circuit 450 may be substantially the same as the delay circuit 250 of FIG. 6, and the control circuit 460 may be substantially the same as the control circuit 360 of FIG. 7. Since the detailed operation method of the signal processing unit 400 is substantially the same as the signal processing circuits 100, 200 and 300 of FIGS. 1, 6 and 7, detailed descriptions thereof will be omitted herein.

Figure 11:
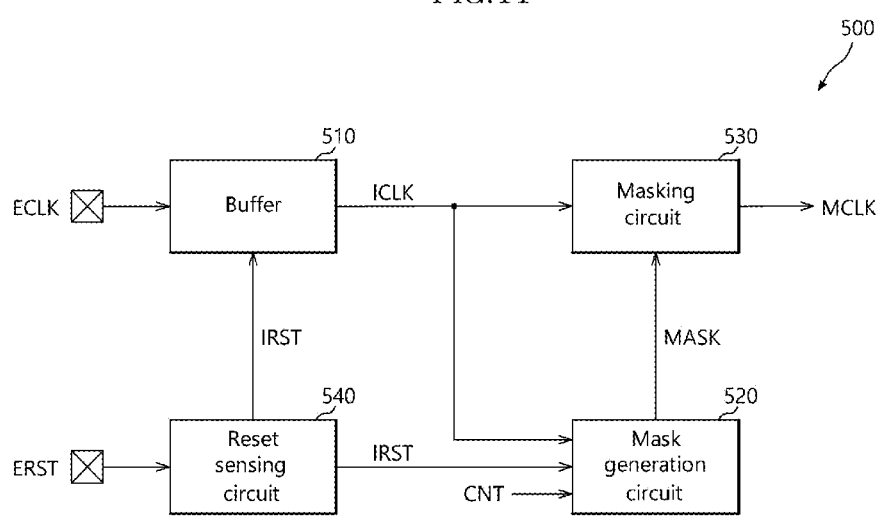
FIG. 11 is a block diagram schematically illustrating a representation of an example of a signal processing circuit of a semiconductor memory device in accordance with an embodiment.

FIG. 11 is a block diagram schematically illustrating a representation of an example of a signal processing circuit 500 of a semiconductor memory device in accordance with an embodiment.

Referring to FIG. 11, when compared to the signal processing circuit 100 of FIG. 1, a buffer 510 may be applied with the internal reset signal IRST transmitted from a reset sensing circuit 540, and may be reset to output a predetermined initial value as the internal control signal ICLK in response to the internal reset signal IRST.

A mask generation circuit 520 may reset the mask signal MASK in response to the internal reset signal IRST, regardless of the initial value of the internal control signal ICLK transmitted from the buffer 510.

Figure 12:
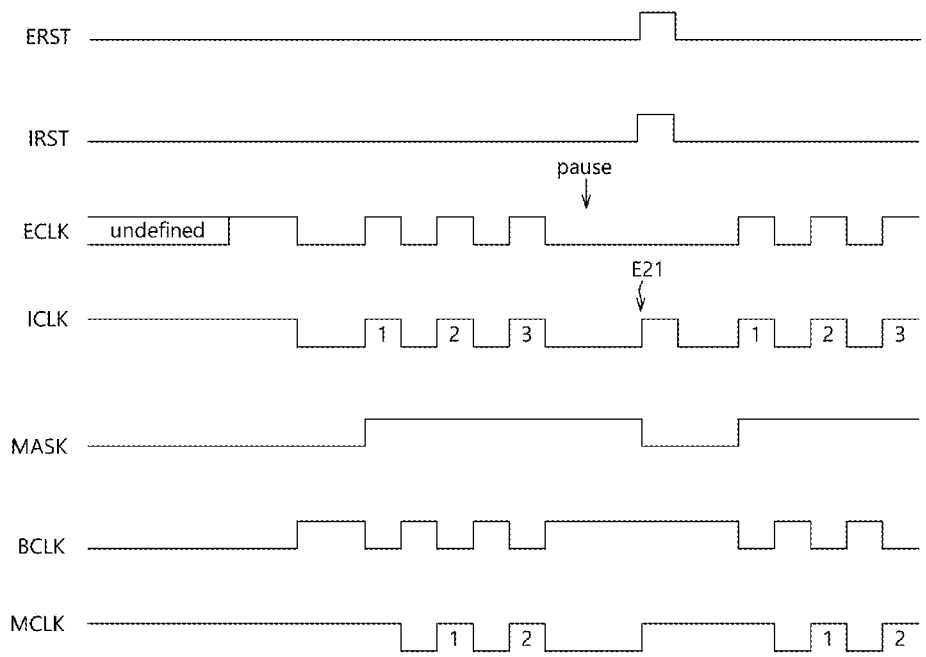
FIG. 12 is a representation of an example of a timing diagram to assist in the explanation of the operation of the signal processing circuit of FIG. 11.

FIG. 12 is a representation of an example of a timing diagram to assist in the explanation of the operation of the signal processing circuit 500 of FIG. 11.

Referring to FIG. 12, the reset sensing circuit 540 may output the internal reset signal IRST in response to the pause reset signal ERST. The buffer 510 may be reset to output the internal control signal ICLK (see E21) of the predetermined initial value, for example, a logic high, in response to the internal reset signal IRST. At this time, although the mask generation circuit 520 receives the rising edge E21 of the internal control signal ICLK, it does not operate since it is reset in response to the internal reset signal IRST.

Figure 13:
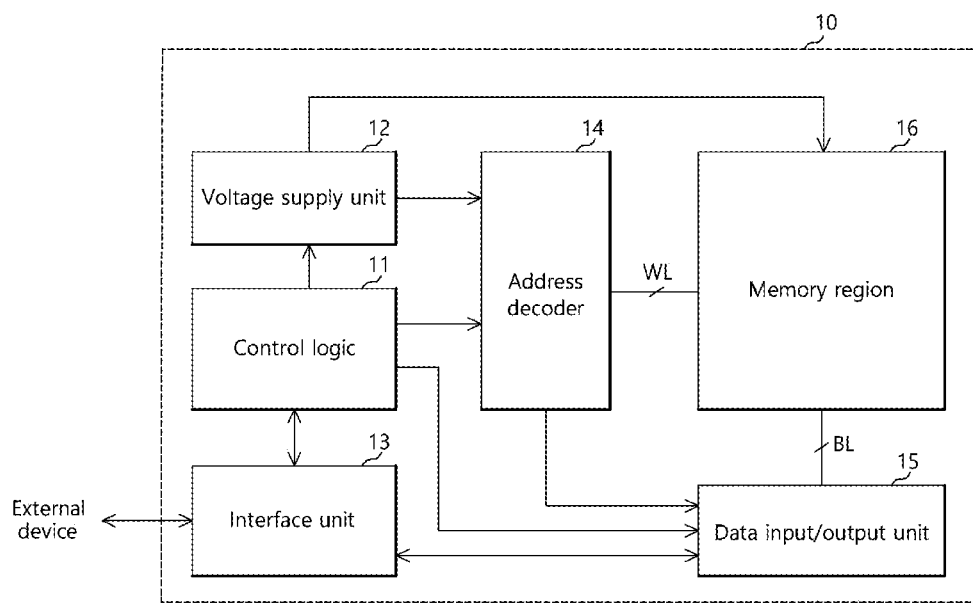
FIG. 13 is a block diagram illustrating a representation of an example of a semiconductor memory device to which a signal processing circuit in accordance with an embodiment is applied.

FIG. 13 is a block diagram illustrating a representation of an example of a semiconductor memory device 10 to which a signal processing circuit in accordance with an embodiment is applied.

The semiconductor memory device 10 may be, for example, a nonvolatile memory device. A nonvolatile memory device may retain stored data even though power is not applied. The nonvolatile memory device may include, for example, a flash memory device such as a NAND flash or a NOR flash, an FeRAM (ferroelectric random access memory), a PCRAM (phase change random access memory), an MRAM (magnetic random access memory) or an ReRAM (resistive random access memory).

Referring to FIG. 13, the semiconductor memory device 10 may include a control logic 11, a voltage supply unit 12, an interface unit 13, an address decoder 14, a data input/output unit 15, and a memory region 16.

The control logic 11 may control general operations of the semiconductor memory device 10 according to control of an external device. The control logic 11 may receive, from an interface, a command transmitted from a controller, and may transmit control signals to internal units of the semiconductor memory device 10 in response to the command.

The voltage supply unit 12 may generate various operation voltages necessary for the general operations of the semiconductor memory device 10, according to control of the control logic 11. For example, the voltage supply unit 12 may supply an erase voltage necessary for an erase operation, to a memory block selected in the memory region 16. For example, the voltage supply unit 12 may supply various voltages to be used in write and read operations, to the address decoder 14.

The interface unit 13 may exchange various kinds of control signals including commands and addresses and data, with the controller. The interface unit 13 may transmit the various kinds of control signals and the data inputted thereto, to the internal units of the semiconductor memory device 10. The interface unit 13 may include any one among the signal processing circuits 100 to 500 of FIGS. 1, 6, 7, 10 and 11. The interface unit 13 may generate a masked control signal (MCLK), and process data transmitted between the external device and the data input/output unit 15, in synchronization with the masked control signal (MCLK).

The address decoder 14 may decode addresses to select portions to be accessed in the memory region 16. The address decoder 14 may selectively drive word lines WL and control the data input/output unit 15 to selectively drive bit lines BL, according to decoding results.

The data input/output unit 15 may transmit data transmitted from the interface unit 13, to the memory region 16 through the bit lines BL. The data input/output unit 15 may transmit data read from the memory region 16 through the bit lines BL, to the interface unit 13. The data input/output unit 15 may sense current formed as memory cells included in the memory region 16 are turned on and off in response to a read voltage, and may acquire data corresponding to the memory cells, according to sensing results.

The memory region 16 may be coupled with the address decoder 14 through the word lines WL, and may be coupled with the data input/output unit 15 through the bit lines BL. The memory region 16 may include a plurality of memory cells which are respectively disposed at areas where the word lines WL and the bit lines BL intersect with each other and in which data are stored. The memory region 16 may include memory cell arrays of a two-dimensional or three-dimensional structure.

Figure 14:
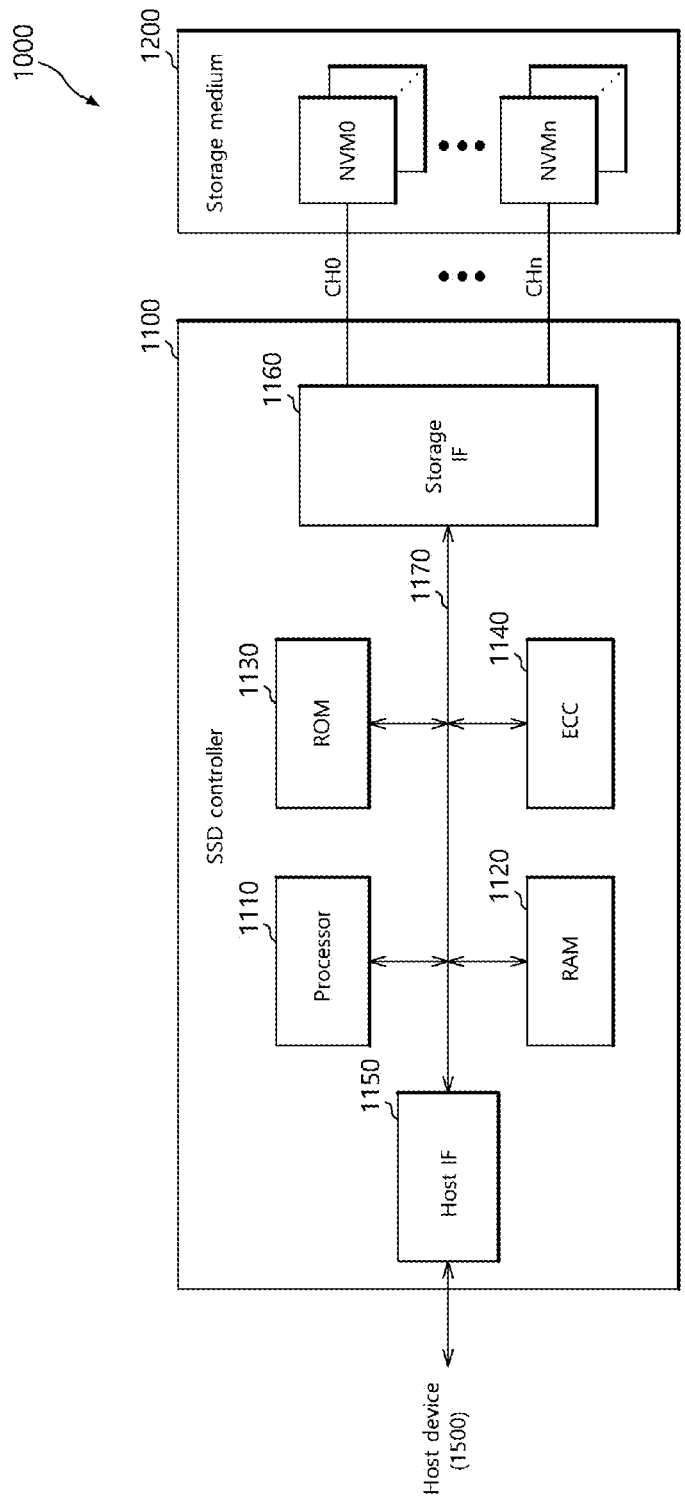
FIG. 14 is a block diagram illustrating a representation of an example of a data storage device in accordance with an embodiment.

FIG. 14 is a block diagram illustrating a representation of an example of a data storage device 1000 in accordance with an embodiment.

The data storage device 1000 may be configured to store data provided from an external device, in response to a write request from the external device. Also, the data storage device 1000 may be configured to provide stored data to the external device, in response to a read request from the external device. The external device as an electronic device capable of processing data may include, for example but not limited to, a computer, a digital camera or a mobile phone. The data storage device 1000 may operate by being built in the external device, or may operate by being manufactured in a separable form and being coupled to the external device.

The data storage device 1000 may be configured by a Personal Computer Memory Card International Association (PCMCIA) card, a compact flash (CF) card, a smart media card, a memory stick, a multimedia card in the form of MMC, eMMC, RS-MMC and MMC-micro, a secure digital card in the form of SD, mini-SD and micro-SD, a universal flash storage (UFS), or a solid state drive (SSD).

Referring to FIG. 14, the data storage device 1000 may include a controller 1100 and a storage medium 1200.

The controller 1100 may control data exchange between the host device 1500 and the storage medium 1200. The controller 1100 may include a processor 1110, a RAM 1120, a ROM 1130, an ECC unit 1140, a host interface (Host IF) 1150, and a storage medium interface (Storage IF) 1160.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control the internal operations of the SSD 1000 such as a merge operation, a wear leveling operation, and so forth.

The processor 1110 may transmit an external control signal (ECLK) for controlling transmission of data to a plurality of respective nonvolatile memory devices NVM0 to NVMn. The processor 1110 may retain the external control signal (ECLK) at a pause polarity to pause input/output of data to and from the nonvolatile memory devices NVM0 to NVMn, and may transmit a pause reset signal (ERST) to exit a pause state.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include the plurality of nonvolatile memory devices NVM0 to NVMn. Each of the plurality of nonvolatile memory devices NVM0 to NVMn may perform a write operation and a read operation according to the control of the controller 1100. Each of the plurality of nonvolatile memory devices NVM0 to NVMn may be configured and operate in the same manner as the semiconductor memory device 10 illustrated in FIG. 13.

Figure 15:
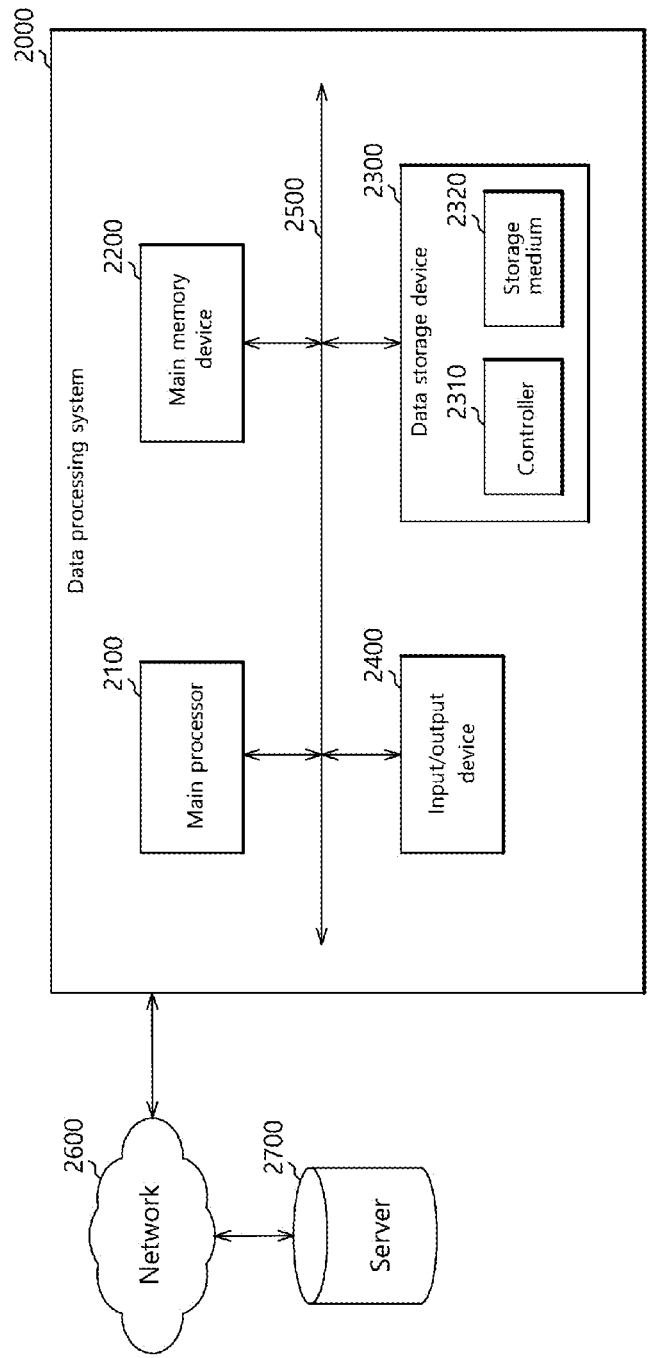
FIG. 15 is a block diagram illustrating a representation of an example of a data processing system in accordance with an embodiment.

FIG. 15 is a block diagram illustrating a representation of an example of a data processing system 2000 in accordance with an embodiment.

The data processing system 2000 may include, for example but not limited to, a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be, for example, a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 1000 illustrated in FIG. 14.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not illustrated) to access the network 2600.

While various embodiments have been described above, it will be understood to those skilled in the art that the embodiments described are examples only. Accordingly, the signal processing circuit described herein should not be limited based on the described embodiments.

What is claimed is:

1. A signal processing circuit comprising:
   a mask generation circuit configured to output a mask signal in response to an internal control signal and masking information; and
   a masking circuit configured to receive the internal control signal, and output a masked control signal by skipping only one or more initial clock cycles in the internal control signal in response to the mask signal,
   wherein the mask generation circuit resets the mask signal in response to an internal reset signal, regardless of a pause polarity of the internal control signal.

2. The signal processing circuit according to claim 1, wherein the mask generation circuit comprises:
   a pre-mask generating circuit configured to shift an input signal in response to a rising edge of the internal control signal, and output a plurality of pre-mask signals; and
   a selecting circuit configured to output any one of the input signal and the pre-mask signals, as the mask signal, in response to the masking information.

3. The signal processing circuit according to claim 1, wherein the masking information includes information on the number of the initial clock cycles to be skipped in the internal control signal.

4. The signal processing circuit according to claim 1, further comprising:
   a buffer configured to output the internal control signal in response to an external control signal,
   wherein the external control signal is retained at a predetermined pause polarity in a pause state.

5. The signal processing circuit according to claim 4, wherein the buffer is reset in response to the internal reset signal to output a predetermined initial value as the internal control signal, and
   wherein the mask generation circuit resets the mask signal in response to the internal reset signal, regardless of the predetermined initial value.

6. The signal processing circuit according to claim 1, further comprising:
   a delay circuit configured to delay the internal control signal and output a delayed control signal, to compensate for a time during which the internal control signal is processed by the mask generation circuit,
   wherein the masking circuit masks the delayed control signal instead of the internal control signal.

7. The signal processing circuit according to claim 1, further comprising:
   a control circuit configured to enable or disable the mask generation circuit by outputting a transfer control signal in response to the internal control signal and the mask signal,
   wherein the mask generation circuit outputs the mask signal in response to the transfer control signal instead of the internal control signal.

8. The signal processing circuit according to claim 7, wherein the control circuit outputs the internal control signal as the transfer control signal which is enabled, in response to the mask signal which is disabled, and blocks the internal control signal and outputs the transfer control signal which is disabled, in response to the mask signal which is enabled.

9. The signal processing circuit according to claim 8, wherein the mask generation circuit is disabled while retaining the enabled mask signal,
   in response to the disabled transfer control signal.

10. The signal processing circuit according to claim 1, further comprising:
    a reset sensing circuit configured to output the internal reset signal in response to a pause reset signal.

11. A signal processing circuit comprising:
    a mask generation circuit configured to output a mask signal in response to an internal control signal; and
    a buffer configured to output the internal control signal in response to an external control signal received by the signal processing circuit,
    wherein the mask generation circuit resets the mask signal in response to an internal reset signal while the internal control signal is in a pause state, regardless of a pause polarity of the internal control signal.

12. The signal processing circuit of claim 11, further comprising:
    a masking circuit configured to mask the internal control signal in response to the mask signal, and output a masked control signal.

13. The signal processing circuit of claim 11, wherein the mask generation circuit is configured to output the mask signal in response to the internal control signal and masking information.

* * * * *